(12) United States Patent
Chao

(10) Patent No.: US 7,787,165 B2
(45) Date of Patent: Aug. 31, 2010

(54) HIGH DENSITY, HIGH BANDWIDTH MULTILEVEL HOLOGRAPHIC MEMORY

(75) Inventor: Tien-Hsin Chao, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/600,402

(22) Filed: Nov. 15, 2006

(65) Prior Publication Data

US 2007/0211322 A1    Sep. 13, 2007

Related U.S. Application Data

(60) Provisional application No. 60/736,655, filed on Nov. 15, 2005.

(51) Int. Cl.
  *G03H 1/28*    (2006.01)
(52) U.S. Cl. .......................................... 359/24; 369/103
(58) Field of Classification Search .................. 359/22, 359/24, 25, 29, 32; 369/103
  See application file for complete search history.

(56) References Cited

U.S. PATENT DOCUMENTS

| 4,052,119 | A | 10/1977 | Williams et al. | |
|---|---|---|---|---|
| 5,377,176 | A | 12/1994 | Redfield | |
| 5,698,344 | A | 12/1997 | Bai et al. | |
| 6,040,930 | A | 3/2000 | Heanue | |
| 2002/0090169 | A1* | 7/2002 | Ducellier et al. | 385/18 |
| 2004/0090899 | A1* | 5/2004 | Gladney et al. | 369/103 |
| 2004/0218241 | A1* | 11/2004 | Roh | 359/35 |
| 2004/0223441 | A1* | 11/2004 | Kuroda | 369/103 |
| 2006/0050339 | A1* | 3/2006 | Kawano et al. | 359/10 |

FOREIGN PATENT DOCUMENTS

EP        1199614 A    4/2002

OTHER PUBLICATIONS

Chao et al., "High Speed High Density Holographic Memory Using Electro-optic Beam Steering Devices" Proceedings of the SPIE, vol. 4803, (2002), pp. 70-73.*
Dana Dudley et al., "Emerging Digital Micromirror Device (DMD) Applications", SPIE Proceedings vol. 4985, 2003.
Larry J. Hornbeck, "Digital Light Processing and MEMS: Timely Convergence for a Bright Future", SPIE Micromachining and Microfabrication '95 Conference on Oct. 23, 1995.

* cited by examiner

*Primary Examiner*—Alessandro Amari
(74) *Attorney, Agent, or Firm*—Gates & Cooper LLP

(57) ABSTRACT

A holographic memory system and apparatus, and a method provide the ability to store multibit holograms in a photorefractive crystal. A single laser diode is configured to emit a collimated laser beam to both write a page of multibit data to and read the page of multibit data from the photorefractive crystal. A multilevel spatial light modulator (DMDSLM) is configured to encode the page of multibit data on an input beam split from the collimated laser beam. A first imaging relay lens pair is positioned between the multilevel spatial light modulator and the photorefractive crystal to image a multibit spatial light modulator image on a plane behind the photorefractive crystal. One or more mirrors are configured to steer a reference beam, split from the collimated laser beam, at high speed to the photorefractive crystal to read or write a page of the multi-bit data.

14 Claims, 9 Drawing Sheets

HIGH DENSITY, HIGH BANDWIDTH MULTILEVEL HOLOGRAPHIC MEMORY

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 60/736,655, filed Nov. 15, 2005, by Tien-Hsin Chao".

This application is related to the following United States patent applications, which applications are incorporated by reference herein:

Utility application Ser. No. 11/462,495, filed on Aug. 4, 2006, by Tien-Hsin Chao, Jay C. Hanan, George F. Reyes, and Hanying Zhou, entitled HOLOGRAPHIC MEMORY USING BEAM STEERING, which application is a divisional application and claims the benefit under 35 U.S.C. Section 120 of Utility application Ser. No. 10/824,722, filed Apr. 15, 2004, by Tien-Hsin Chao, Jay C. Hanan, George F. Reyes, and Hanying Zhou, entitled HOLOGRAPHIC MEMORY USING BEAM STEERING, which application claims the benefit under 35 U.S.C. Section 119(e) of the following co-pending and commonly-assigned U.S. provisional patent application(s), which is/are incorporated by reference herein:

Provisional Application Ser. No. 60/463,821, filed on Apr. 18, 2003, by Tien-Hsin Chao, Hanying Zhou, and George F. Reyes, entitled "COMPACT HOLOGRAPHIC DATA STORAGE SYSTEM,"; and Provisional Application Ser. No. 60/535,205, filed on Jan. 9, 2004, by Tien-Hsin Chao, Jay C. Hanan, and George F. Reyes, entitled "HIGH DENSITY HIGH RATE HOLOGRAPHIC MEMORY USING A MEMS MIRROR BEAM STEERING DEVICE,".

STATEMENT REGARDING FEDERALLY SPONSORED RESEARCH AND DEVELOPMENT

The invention described herein was made in the performance of work under a NASA contract, and is subject to the provisions of Public Law 96-517 (35 U.S.C. §202) in which the Contractor has elected to retain title.

BACKGROUND OF THE INVENTION

1. Field of the Invention

The present invention relates generally to holography, and in particular, to an ultrahigh density and ultrahigh bandwidth holographic memory.

2. Description of the Related Art

Many devices (e.g., compact discs and digital video discs) use light to store and read data. However, prior art optical storage methods have limited transfer and capacity capabilities. To overcome the disadvantages of the prior art, holographic memory may be used. Holographic memory stores information beneath the surface of the recording medium and uses the volume of the recording medium for storage. However, holographic memory may have speed limitations with respect to recording data and/or reading the data from the storage medium. In addition, holographic memory density may be limited. These problems may be better understood by describing the future needs for memory and prior art holographic memory systems.

Current technology, as driven by the personal computer and commercial electronics market, is focusing on the development of various incarnations of Static Random Access Memory (SRAM), Dynamic Random Access Memory (DRAM), and Flash memories. Both DRAM and SRAM are volatile. Their densities are approaching 256 Mbits per die. Advanced 3-D multichip module (MCM) packaging technology has been used to develop solid-state recorder (SSR) with storage capacity of up to 100 Gbs. The flash memory, being non-volatile, is rapidly gaining popularity. Densities of flash memory of 256 Mbits per die exist in the prior art. High density SSR could also be developed using the 3-D MCM technology. However, flash memory is presently faced with two insurmountable limitations: limited endurance (breakdown after repeated read/write cycles), and poor radiation-resistance (due to simplification in power circuitry for ultra-high density package).

NASA's future missions may require massive high-speed onboard data storage capability to support Earth Science missions. With regard to Earth science observation, a 1999 joint Jet Propulsion Laboratory and Goddard Space Flight Center (GFSC) study ("The High Data Rate Instrument Study") has pointed out that the onboard science data (collected by high date rate instruments such as hyperspectral and synthetic aperture radar) stored between downlinks would be up to 40 terabits (Tb) by 2003. However, onboard storage capability in 2003 was estimated at only 4 Tb that is only 10% of the requirement. The storage capability has fallen further behind and now likely supports merely 1% of the onboard storage requirements.

Accordingly, prior art electronic memory cannot satisfy all NASA mission needs. Thus, what is needed is a new memory technology that would simultaneously satisfy non-volatility, rad-hard, long endurance as well as high density, high transfer rate, low power, mass and volume to meet all NASA mission needs.

Volume holography has been predominantly considered as a high-density data storage technology. With volume holography, the volume of the recording medium is utilized for storage instead of only utilizing the surface area (such as with compact discs [CDs] and/or digital video discs [DVDs]). Traditionally, when a laser is fired, a beam splitter is utilized to create two beams. One beam, referred to as the object or signal beam/wavefront travels through a spatial light modulator (SLM) that shows pages of raw binary data as clear and dark boxes. The information from the page of binary code is carried by the signal beam to a light-sensitive lithium-niobate crystal (or any other holographic materials such as a photopolymer in place of the crystal). The second beam (produced by the beam splitter), called the reference beam, proceeds through a separate path to the crystal. When the two beams meet, the interference pattern that is created stores the data carried by the signal beam in a specific area in the crystal as a hologram (also referred to as a holographic grating).

Depending on the angle of the reference beam used to store the data, various pages of data may be stored in the same area of the crystal. To retrieve data stored in the crystal, the reference beam is projected into the crystal at exactly the same angle at which it entered to store that page of data. If the reference beam is not projected at exactly the same angle, the page retrieval may fail. The beam is diffracted by the crystal thereby allowing the recreation of the page that was stored at the particular location. The recreated page may then be projected onto a charge-coupled device (e.g., CCD camera), that may interpret and forward the data to a computer.

Thus, as described above, a complex data-encoded signal wavefront is recorded inside a media as sophisticated holographic gratings by interference with a selective coherent reference beam. The signal wavefront is recovered later by reading out with the same corresponding reference beam.

Bragg's law determines that the diffracted light intensity is significant only when the diffracted light is spatially coherent and constructively in phase. Bragg's law is often used to explain the interference pattern of beams scattered by crystals. Due to the highly spatial and wavelength Bragg selectivity of a crystal, a large number of holograms can be stored and read out selectively in the same volume. Accordingly, there is a potential for one bit per wavelength cube data storage volume density and intrinsic parallelism of data accessing up to Mbytes per hologram.

In addition, it can be noted that prior art holographic memory density can reach 1 terabyte by using binary holograms (i.e., pixel value is either 0 or 1). With such a system, a transfer rate can be achieved with up to 1 Gbit/sec. However, such system may still be at least one order of magnitude lower than many current storage needs.

The storage density and transfer rate using the prior art binary-valued holograms used in such a system cannot be increased by one order of magnitude without significantly increasing the system volume and power consumption. Accordingly, a new holographic memory architecture may be necessary to satisfy the density/bandwidth needs while meeting the volume/mass/power consumption constraints of many applications (e.g., NASA and Department of Defense applications).

Accordingly, as described above, the prior art fails to provide sufficient memory capabilities. Prior art holographic memory systems have evolved in an attempt to provide such capabilities. However, the prior art holographic memory systems may still be improved in storage capacity/density, efficiency, speed, resistance to radiation, etc.

SUMMARY OF THE INVENTION

As a technique to numerically record and reconstruct entire optical wave fronts, digital holography is of great interests to fields such as metrology, display, data storage, and authentication. Fast spatial light modulators exhibiting large light throughputs and good diffraction efficiencies are necessary to provide adequate optical reconstructions of digital holograms.

One or more embodiments of the invention utilize a multilevel hologram recording and readout system that significantly increases the storage density of the holographic medium. In this regard, a digital micromirror device SLM (or deformable mirror device SLM) (referred to as a DMDSLM) is used to provide superior light throughput, diffraction efficiency, contrast, and grayscale range relative to transmissive LCD, with no ill effects observed due to the physical movement of the mirrors. Such a DMDSLM may be used in either binary or pulse-width modulation (PWM) mode to provide the significant benefits of the invention.

In addition, the invention combines the ability to use the DMDSLM for the input beam with high speed beam steering for the reference beam.

In view of the above, the holographic memory system of the invention utilizes a photorefractive crystal that is configured to store multibit holograms. A single laser diode is configured to emit a collimated laser beam to both write a page of multibit data to and read the page of multibit data from the photorefractive crystal. A multilevel spatial light modulator is used to encode the page of multibit data on an input beam split from the collimated laser beam. A first imaging relay lens pair is positioned between the multilevel spatial light modulator and the photorefractive crystal and images a multibit spatial light modulator image on a plane behind the photorefractive crystal. Mirrors are then used to steer a reference beam, split from the collimated laser beam, at high speed to the photorefractive crystal to read or write a page of multi-bit data. Such high speed beam steering devices may comprises either liquid crystal phase arrays or Micro-Electro-Mechanical Systems (MEMS) mirrors.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One or more embodiments of the invention provide a new concept and system architecture for an ultrahigh density (terabytes) and ultrahigh bandwidth (Gigabits/sec) holographic memory. A multilevel hologram recording and readout system is used to replace the prior art binary holograms. For example, prior art holographic memory density can reach 1 terabyte by using binary holograms (e.g., 1 pixel value is either 0 or 1). By using a multilevel hologram, a 3-bit (8 digits) hologram can be used to increase the storage density up to eight (8) terabytes. An 8-bit hologram can increase the storage density to 256 terabytes without significantly increasing the prior art system volume, mass, and power consumption.

Holographic Data Storage

As described above, holographic data storage may store data in a large number of holograms inside of a photorefractive crystal. Holograms may be formed by recording (in a cubic photorefractive crystal) the light interference pattern caused by a data beam carrying page data (image or binary bits) and a reference laser beam. Since these images are stored in the Fourier domain and recorded in three dimensions, massive redundancy is built into the holograms such that the stored holograms would not suffer from imperfections in the media or point defects.

The $LiNbO_3$ photorefractive crystal has been the most mature recording material for holographic memory due to its uniformity, high electro-optical coefficient, high photon sensitivity, and commercial availability. One unique advantage for using holographic data storage is its rad hard (radiation hardened) capability. Holograms stored in photorefractive crystal have been experimentally proven to be radiation resistant. For example, when a Lithium Niobate holographic memory was flown in space, the retrieved crystals only suffered surface damage and still retained their photosensitivity for hologram recordings.

Compact Holographic Memory Using Beam Steering

One key aspect needed to achieve high-speed data transfer rates in a holographic memory system is the laser beam steering methodology. Various methods/systems may be used to improve the speed using beam steering.

Liquid Crystal Beam Steering Devices

Figure 1:
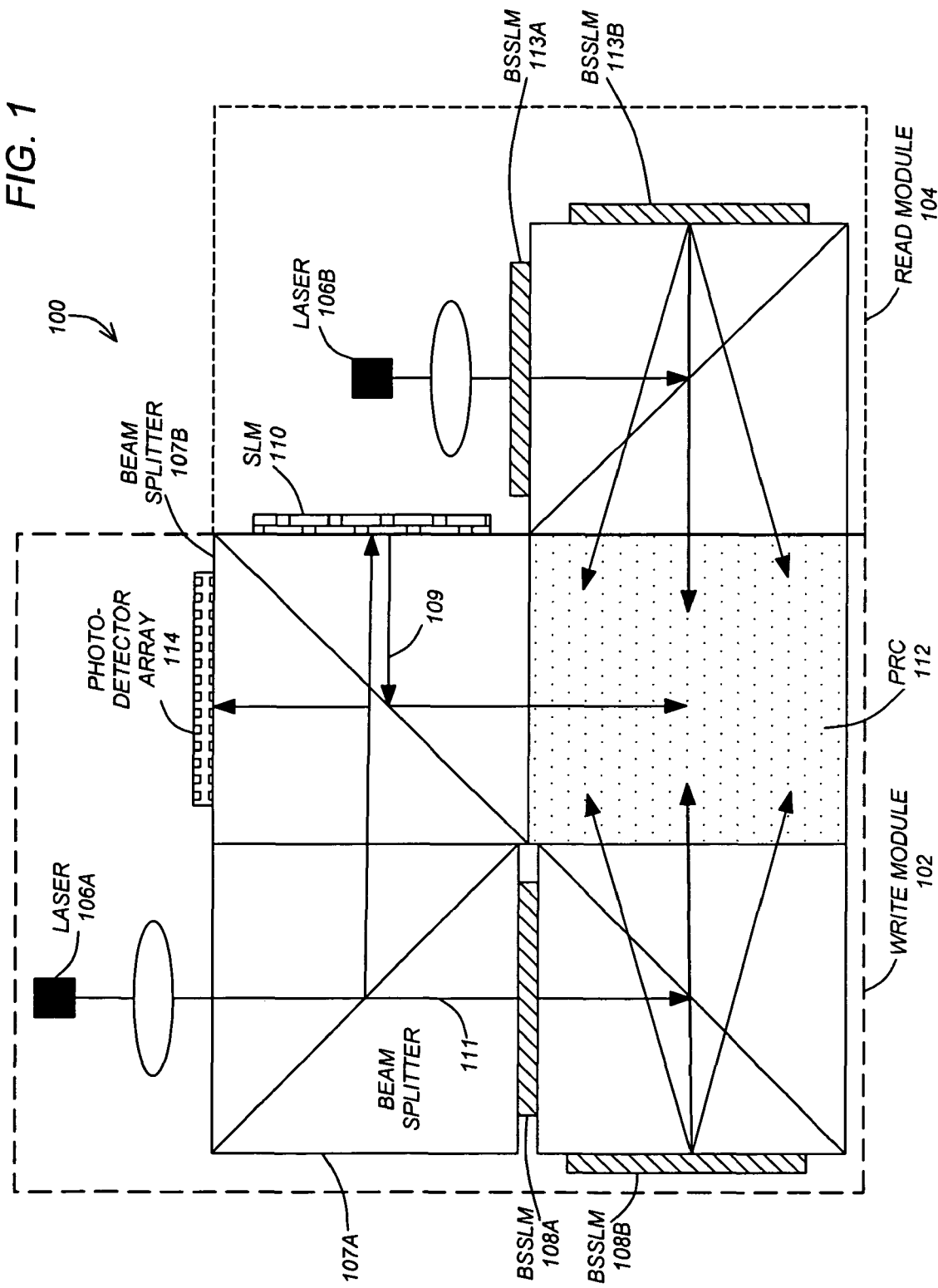
FIG. 1 illustrates a schematic architecture that utilizes a liquid crystal BSSLM in accordance with one or more embodiments of the invention.

In accordance with one or more embodiments of the invention, a liquid crystal beam steering spatial light modulator (BSSLM) is used for high-speed beam steering. FIG. 1 illustrates a schematic architecture that utilizes a liquid crystal BSSLM in accordance with one or more embodiments of the invention. The architecture 100 consists of a writing module 102 for multiple hologram recordings and a readout module 104 for hologram readout.

The writing module 102 includes a laser diode 106A as the coherent light source, a pair of cascaded BSSLMs 108, one transmissive 108A and one reflective 108B in each pair, for angular multiplexed beam steering, a data SLM 110 for data input for storage, two cubic beam splitters 107A and 107B for beam forming, and a photorefractive crystal 112 for hologram recording.

The readout module 104 also shares the photorefractive crystal 112. The readout module includes a laser diode 106B with the same wavelength as the writing laser diode 106A, a pair of cascaded BSSLMs 113A and 113B to generate phase conjugated readout beams (i.e., the readout beam is directed opposite to the writing beam), the shared photorefractive crystal 112, a cubic beam splitter, and a photodetector array 114 for recording the readout holograms. The system uses an angular multiplexing scheme to store multiple holograms and phase-conjugated beams to read out each hologram.

In hologram writing, the collimated laser beam 106A splits into two parts at the first cubic beam splitter 107A. The horizontally deflected light travels across the second cubic beam splitter 107B to read out the input data after impinging upon the data SLM 110. The data carrying beam 109 is then reflected into the PR crystal 112 as the data writing beam.

The remaining part of the laser beam 111 travels vertically, passing a BSSLM 108A and is then reflected to the second reflective BSSLM 108B. Both BSSLMs 108 are 1-dimensional blazed phase gratings capable of beam steering with an angular deflection determined by the grating periods. By cascading two BSSLMs 108 in orthogonal, 2-dimensional beam steering can be achieved. Alternatively, a single 2-D beam steering SLM could be used. The deflected laser beam 111 is directed towards the PR crystal 112 to form an interference grating (hologram). Each individual hologram is written with a unique reference angle and can only be read out at this angle (or its conjugated one). By varying the reference beam angle 111 in sequential recording, a very large number of holograms can be recorded in the recording medium.

For hologram readout, an innovative phase conjugation architecture is illustrated in FIG. 1. The phase conjugation scheme enables lensless hologram readout with minimal distortion (low bit error rate). As shown in FIG. 1, a second pair of transmissive 113A and reflective 113B BSSLMs are used to provide a phase-conjugated readout beam (with respect to the writing reference beam). After the beam impinges upon the PR crystal 112, the diffracted beam from the recorded hologram exits the PR crystal 112 back tracking the input data beam path, due to the phase-conjugation property. The beam then directly impinges upon the photodetector array 114 without the need for focusing optics and reconstructing the corresponding data page, as was recorded and stored in the PR crystal 112.

Electro-Optic Beam Steering

Figure 2:
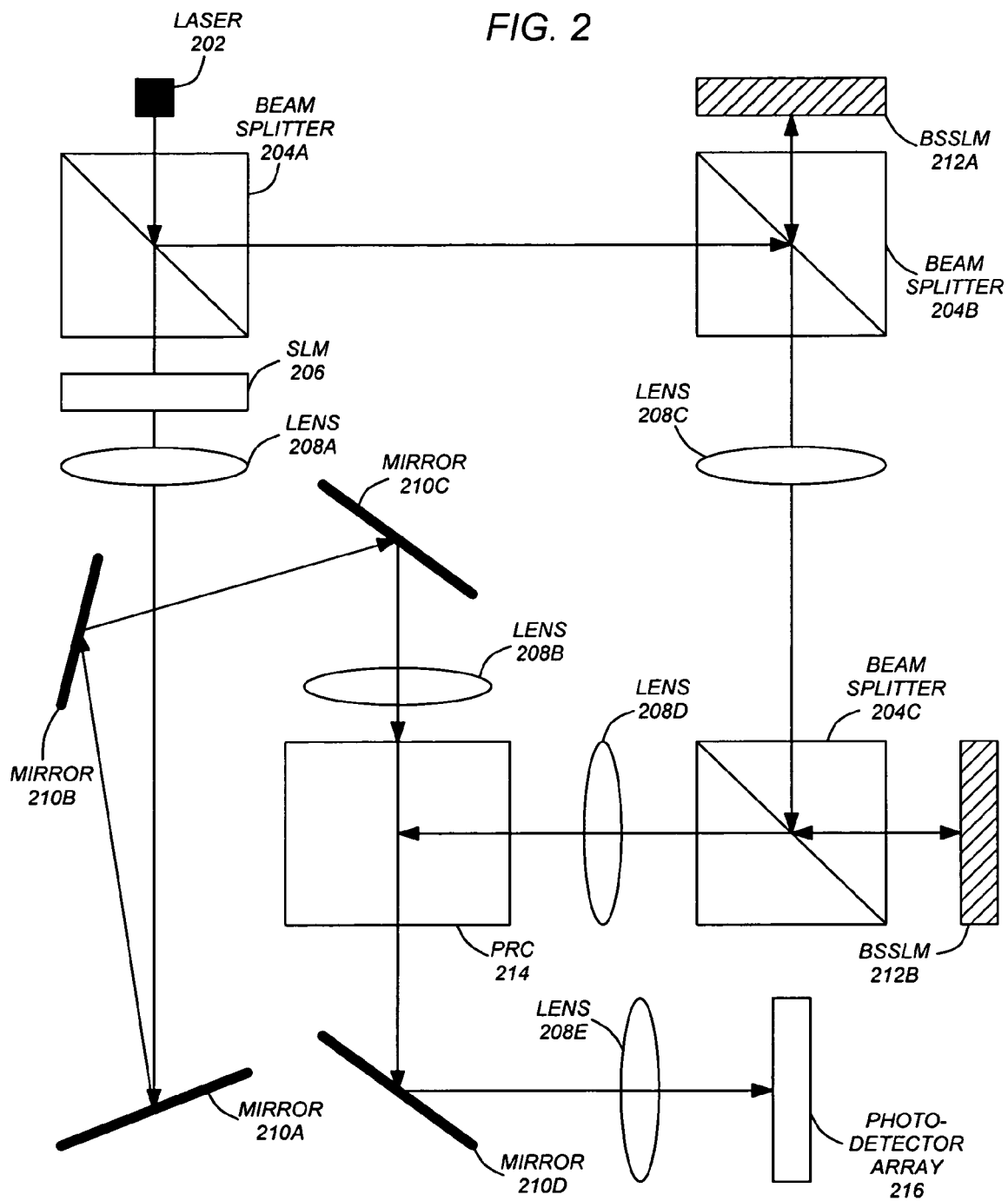
FIG. 2 illustrates electro-optic beam steering in accordance with one or more embodiments of the invention.

In an alternative embodiment of the invention, electro-optic beam steering as illustrated in FIG. 2 may be used. Collimated laser beam 202 first enters the polarizing beam splitter 204A where it is split into two beams. The input beam subsequently passes through the data SLM 206, lens 208A, mirror 210A, mirror 210B, mirror 210C, lens 208B, and then enters the PRC 214 (a $Fe:LiNbO_3$ photorefractive crystal).

The lens pair 208A and 208B will relay the data SLM 206 throughput image onto the PRC 214. The mirror set 210A-210C fold and increase the light path length to make it equal to that of the reference beam.

The reference beam, after exiting the beam splitter 204A, passes through beam splitter 204B, BSSLM 212A, beam splitter 204B (again), lens 208C, beam splitter 204C, BSSLM 212B, beam splitter 204C (again), lens 208D, and arrives at PRC 214.

The data beam and reference beam intersect within the volume of the PRC 214 forming a 90° recording geometry. Both beams are polarized in the direction perpendicular to the incident plane (the plane formed by the reference and signal beams). Lens pair 208C and 208D relay the BSSLM 212A onto the PRC 214 surface. BSSLM 212A scans the reference beam along the horizontal plane (or the x-axis) in parallel with the C-axis. BSSLM 212B steers the reference beam in the vertical plane (y-axis, or the fractal plane). During holographic data recording, the interference pattern formed by each page of input data is recorded in the PR crystal 214. The reference beam angle (and location) is altered with each subsequent page of input data. During readout, the data beam is shut down and the reference beam is activated to illuminate the PR crystal 214.

Due to the principle of holographic wavefront reconstruction, the stored page data, corresponding to the specific reference beam angle, may be read out. The readout data beam exits the PRC 214 and passes through mirror 210D and lens 208E before reaching the photodetector (PD) array 216. Note that the lens set 208A, 208B and 208E relays the input SLM 206 to the PD array 216. The magnification factor, caused by the lens set, is determined by the aspect ratio between the data SLM 206 and the PD array 216.

As depicted in FIG. 2, by using two 1-dimensional BSSLMs 212A and 212B cascaded in an orthogonal configuration, a 2-dimensional angular fractal multiplexing scheme is formed, in a breadboard setup that enables high-density recording and retrieval of holographic data.

In experiments, holograms were first multiplexed with x-direction (in-plane) angle changes while y-direction angle hold unchanged. After finishing the recording of a row of holograms, the y-direction was changed (perpendicular to the incident plane) angle, and the next row of holograms was recorded with x-direction angle changes. Both x and y angle changes are fully computer controlled and can be randomly accessed. Accordingly, the recording and retrieval of long video clips of high quality holograms may be conducted.

Advantages of the use of an electro-optic beam steering scheme may include the absence of mechanical motion, high-transfer rate (1 Gb/sec), random access data addressing, low-volume, and low power.

Beam Steering Spatial Light Modulator

The BSSLMs described above may be implemented in a device built upon a VLSI back plane in a ceramic PGA (pin grid array) carrier. A 1-dimensional array of 4096 pixels, filled with nematic twist liquid crystal (NTLC), is developed on the SLM (spatial light modulator) surface. The device aperture is of the size of 7.4 µm×7.4 µm, each pixel is of 1.18 µm×7.4 µm in dimension. The response time of such an embodiment may reach 200 frames/sect.

Further, the NTLC in the above embodiments may be replaced with Ferroelectric Liquid Crystal (FLC). The use of FLC may increase the speed by one order of magnitude (i.e., >2000 frames/sec).

As described above, some advantages of using such an electro-optic beam steering device for angular multiplexing for holographic data storage include, no mechanical moving parts, randomly accessible beam steering, low voltage/power consumption, large aperture operation, and no need for bulky frequency-compensation optics as in AO based devices.

In addition to the above, a custom phase-array profile driver may be used with a LabView™ based system HW/SW controller for the downloading of a driving profile to the BSSLM.

Holographic Memory Storage Capacity and Transfer Rate

Various different sizes and types of devices may be used in accordance with embodiments of the invention.

For example, it has been demonstrated that up to 160,000 pages (i.e. 160 Gbs of memory) of hologram can be stored in a LiNbO$_3$ PR crystal with 1 cm$^3$ volume using a scanning mirror to create angular multiplexing for each reference beam. However, the scanning mirror scheme that requires mechanically controlled moving parts is not suitable for space flight. Accordingly, one or more embodiments of the invention may provide an all electro-optic controlled angular multiplexing scheme with high-speed and high resolution. In this regard, as described above, the invention may utilize an all-phase beam steering device, the BSSLM.

Both transmissive and reflective BSSLMs may be used in an advanced holographic memory (AHM) system. An example of a transmissive BSSLM device is a 1×1024 array with resolvable spots about 64. An example of a reflective BSSLM device is a silicon-based 1-D diffractive beam steering device. Such a reflective BSSLM device may be a 1×4096 array that has approximately 128 resolvable spots. Devices with a higher number of resolvable spots (around 180) may also be provided in accordance with embodiments of the invention. Thus, total resolvable spots from cascaded BSSLMs may be around 11,520. By using two cascaded BSSLMs for beam steering, a total of more than 10,000 pages of hologram can be stored and readout in a single cubic centimeter of PR crystal. Since each page can store about 1000×1000 pixels of data (1 Mbytes), the total storage capacity can reach 10 Gigabytes.

In another example, a 1×4096 array may be used with an aperture size of 7.4 mm×7.4 mm. Alternatively, the array size may be expanded to 2.5 mm×2.5 mm (1 in$^2$) and the corresponding array density would be 1×12000. Thus, the number of resolvable angles would be increased to 2666.

From the above information, it may be seen that the Liquid Crystal BSSLM utilized in a holographic memory setup of the invention may be appropriate for high-density holographic storage. With additional upgrades in BSSLM performance, the total number of the holograms that can be recorded in a holographic memory breadboard may easily exceed 20,000. Such a holographic breadboard may be configured by recording 2000 holograms in each x-dimension row (i.e. the angular direction) and 10 rows in y-dimension (i.e. the fractal direction).

The storage capacity of such a holographic memory system, with using the upgraded electro-optic BSSLM, would then exceed 20 Gb for a 1000 pixel×1000-pixel input page. It would further increase to 500 Gb by using a 5000 pixel×5000 pixel input page. Further miniaturization would make enable the reduction of the holographic memory into a 5 cm×5 cm×1 cm cube. By stacking a multiple of such holographic memory cubes on a memory card (e.g. 10×10 cubes on each card), a storage capacity of 2-50 Tb per card may be achieved. The transfer rate of such a holographic memory system may range from 200 Mb/sec (200 pages/sec, with a 1 M pixel page) to 5 Gb/sec (200 pages/sec, with a 25 M pixel page).

Figure 3:
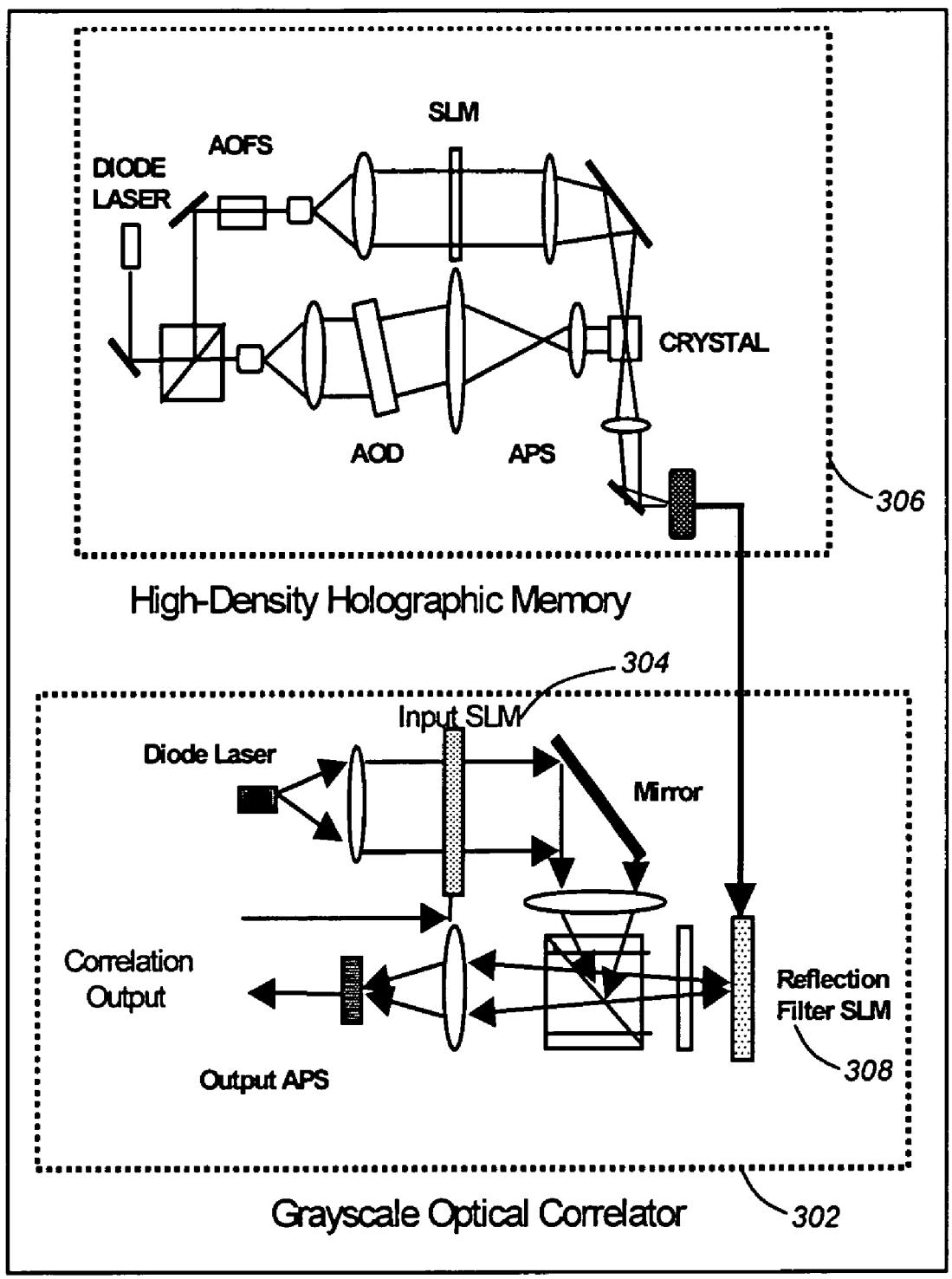
FIG. 3 illustrates a system architecture of an optical correlator using holographically stored and retrieved filter data for real-time optical pattern recognition in accordance with one or more embodiments of the invention.

Applying Advanced Holographic Memory (AHM) Technology to Support Massive Storage Needs of Optical Patterns The AHM technology may support the massive data storage needs of an optical pattern recognition system. In this regard, gray scale optical correlators have been extensively developed and applied for pattern recognition. The invention provides a compact grayscale optical correlator (GOC) 302 for real-time automatic target recognition (ATR). As shown in FIG. 3, such an optical correlator 302 may employ a Liquid Crystal Spatial Light Modulator (LC SLM) 304, with 8-bit grayscale resolution for input incoherent-to-coherent image conversion. FIG. 3 illustrates a system architecture of an optical correlator 302 using holographically stored and retrieved filter data for real-time optical pattern recognition. The readout data containing grayscale MACH (maximum average correlation height) filter data from a high-density holographic memory 306 is directly fed into the filter SLM driver 308 of a GOC 302 to enable real-time ATR.

In the Fourier transform plane, a bipolar-amplitude (i.e. real-valued) SLM may be used to encode the correlation filter. The real-valued correlation filter encoding capability has enabled the use of a very powerful optimum filter computation algorithm, Maximum Average Correlation Height (MACH), for distortion invariant correlation computation.

One of the major limitations for more versatile ATR using this GOC 302 is the severe limitation size limitation of electronic memory. Such a GOC 302 is capable for updating the correlation filter at a rate of 1000 frames/sec. Each filter consists of 512-pixel×512-pixel with 8-bit grayscale resolution. Thus, to operate the correlator 302 at full speed, the filter data throughput will be at 2 Gigabit/sec. This transfer rate is far beyond that of magnetic hard disk. Only SDRAM could be used with adequate data transfer rate. However, to save a modest number of 1000 filters on-board, it would need two Gigabits of SDRAM memory. The memory board size and power consumption is too excessive for many air and space-borne systems to accommodate. Therefore, the invention utilizes holographic memory 306 as an alternative memory solution for real-time pattern recognition using a GOC 302.

Unique advantages of using holographic memory system for updatable optical correlator applications including high storage density, random access, high data transfer rate, and grayscale image storage capability. All these three characteristics very well meet the memory requirements of a GOC 302.

Experimental Demonstration of Optical Pattern Recognition Using Optical Correlator with Holographic Memory One or more embodiments of the invention utilize a portable GOC with optically implemented MACH (maximum average correlation height) correlation filters.

An experimental demonstration has illustrated real-time optical pattern recognition. During such an experimental test, a camcorder-sized GOC may be used to perform real-time pattern recognition. A CHDS (compact holographic data storage) breadboard may be used to store and readout MACH correlation filters. The experimental steps may be described as follows. First, a set of training images may be selected for developing MACH correlation filters. Second, these MACH filters may be recorded into a CHDS breadboard and subsequently readout and downloaded into a filter driver of the GOC. The dynamic range of the retrieved holographic filter image may then be carefully preserved to retain the 8-bit resolution.

For real-time optical pattern recognition operation, a large bank of MACH correlation filter data would be first stored in an acousto-based holographic memory 306 as shown in FIG. 3. The readout holographic data would then be directly fed into the filter SLM driver 308 of the GOC 302 to support the high-speed filter updating needs.

After the holographically retrieved MACH filter image is downloaded into the filter SLM 308 of the GOC 302, a video of input scene recorded from a previous flight test, may be fed into the input SLM 304. Sharp correlation peaks associated with the input target in various rotations, scale and perspective may be successfully obtained from the correlation output.

Holographic Memory Breadboard with 1D and 2D Electro-Optic Beam Steering

One or more embodiments of the invention may be implemented in a book-sized 1-D holographic memory breadboard. Such an implementation may demonstrate the feasibility of using a BSSLM device for beam steering to meet the multiplexing needs during holographic data recording and retrieval. Further, such a system may utilize a single BSSLM and can demonstrate 1-D beam steering for angular multiplexing. In addition to the above, a typical such system may measure 30 cm×20 cm×5 cm, the size of a phone book.

Alternatively, embodiments may be implemented in a CD-sized compact holographic memory breadboard with 2D electro-optical angular-fractal beam steering. Such a CD-sized holographic memory breadboard can be a very compact holographic memory module, measuring 10 cm×10 cm×1 cm. The compact size of the VLSI based BSSLM together with advanced optics design enables a drastic reduction in the system volume from book-size to CD-size. Such a breadboard is capable of recording 10 GB of holographic data. Further, the system design makes it possible for easy replacement of key devices when an upgraded version becomes available. Such key devices include the Spatial Light Modulator, the BSSLM, and the PD (photodetector) array. Moreover, the system storage capacity may increase by up to 2 orders of magnitude with the use of a high-resolution BSSLM.

The CD-sized holographic memory breadboard may be developed with a comprehensive LabView™ based system controller. Hence, autonomous data recording and retrieval is available upon full integration of the system.

Thus, as described above, an advanced holographic memory technology may be used to enable high-density and high-speed holographic data storage with random access during data recording and readout. An innovative E-O (electro-optical) beam steering scheme, achieved by utilizing a liquid crystal beam steering device has been shown. Further, a CD-sized holographic memory breadboard may be integrated and used for successful holographic data recording and retrieval. Such a breadboard is compact with a storage capacity range from 10 Gb to 250 Gb, depending on the input page size.

MEMS Mirror for High-Speed Beam Steering

Although the liquid crystal (LC) BSSLM phase array has been successfully utilized for high-speed beam steering in a compact holographic memory breadboard, it would be beneficial to improve the light throughput efficiency. Due to the light diffraction of the throughput light beams by the phase array in a LC BSSLM, there are many diffracted orders (other than the first order of diffracted laser beams) that are used for hologram recording. Since it is very difficult to achieve 100% diffraction efficiency in the first order, a considerable amount of laser beam energy is spread into the zero order and high order of diffraction. The high-order-light beams cause spurious interference that often reduces the signal-to-noise ratio of the recorded holograms.

Therefore, one or more embodiments of the invention provides for a high-speed scanning mirror that utilizes light deflection instead of diffraction as the beam steering device. The prior art illustrates the use of galvanometer controlled mirrors for laser beam steering applications. However, the considerable mass of the galvanometer mirror may severely limit its scanning speed (e.g. no more than video rate). In view of the limitations of the prior art, the invention provides for the use of emerging MEMS (Micro-Electro-Mechanical Systems) mirror technology for high-speed beam steering in a compact holographic memory system.

Micro-Electro-Mechanical Systems (MEMS) is the integration of mechanical elements, sensors, actuators, and electronics on a common silicon substrate through microfabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electro-mechanical devices.

MEMS Micro-mirrors are mirrors that have been "shrunk" down to the microscopic world. Such MEMS Micro-mirrors may be used in many ways including application in the field of fiber optics. Alternatively, the MEMS Micro-mirrors may be utilized for beam steering in a holographic memory system.

The fabrication method for these micro-mirrors is similar (or identical) to that of a cantilever structure except that after the process is completed, a reflective layer, such as aluminum, may be placed on top of the beam.

A MEMS micro-mirror utilizes electrostatic actuation for mirror steering. Since positive and negative charges attract each other (and like charges repel), if a cantilever can be made to keep a positive charge while placing an alternating positive-negative charge above it, then by electrostatics, the cantilever will resonate up and down.

In view of the above, a MEMS mirror can be attractive as a beam steering device in a holographic memory system. Advantages of using a MEMS mirror as a beam steering device include: high light throughput efficiency (>99% reflectivity), superior beam quality (light reflected from a mirror does not generate spurious diffraction as that of a diffractive beam steering device), low mass and high-speed.

Figure 4A:
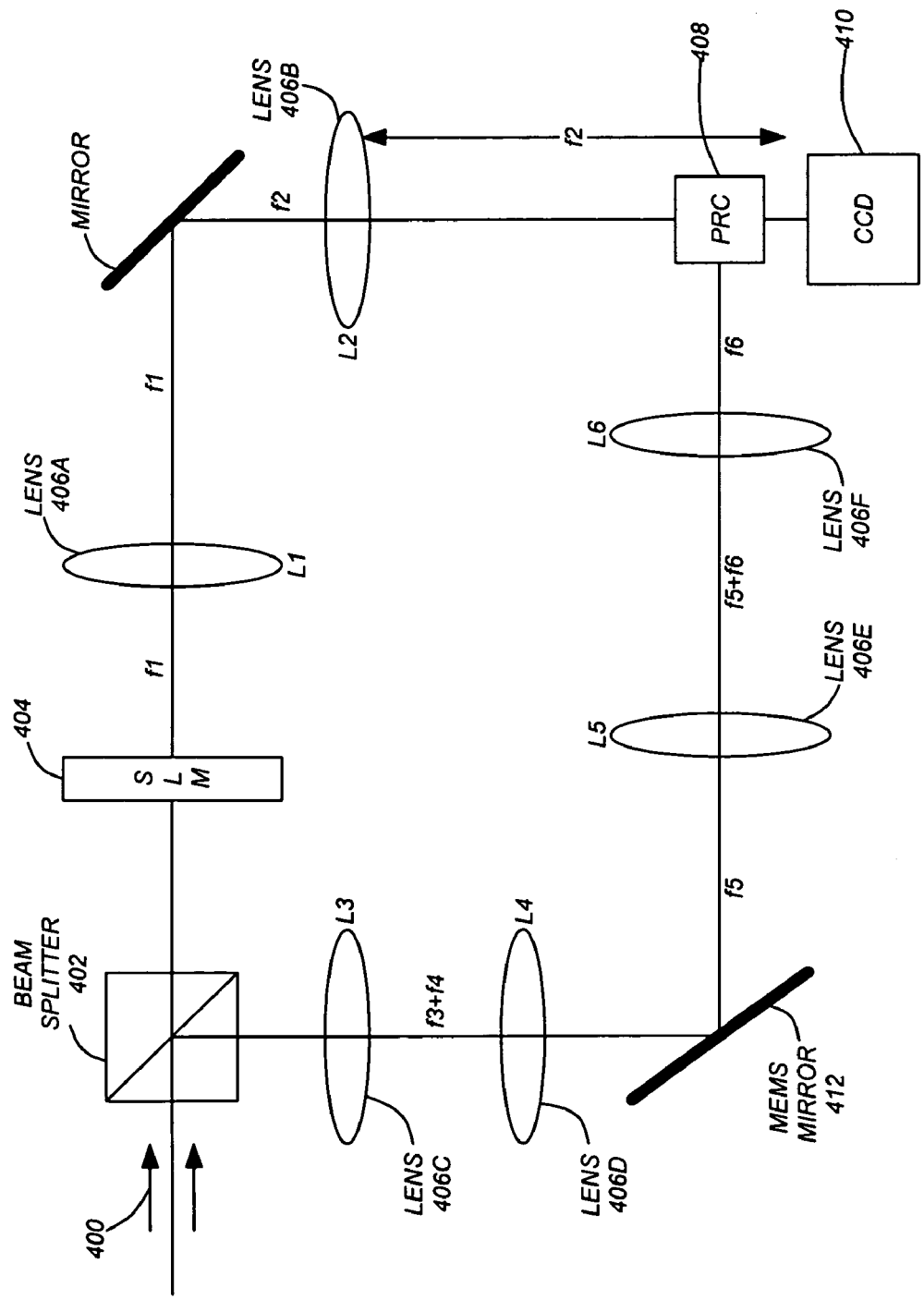
FIG. 4A illustrates a holographic memory system architecture utilizing the MEMS mirror for beam steering in accordance with one or more embodiments of the invention.

A holographic memory system architecture utilizing the MEMS mirror for beam steering is shown in FIG. 4A. Details of the system layout provide that a collimated laser beam 400 first enters a polarizing beam splitter 402, and on exit is split into two beams. The input beam subsequently passes through the data SLM (spatial light modulator) 404, and image relaying lens pair 406A-406B (also referred to as lens L1 and L2 having focal distances f1 and f2 respectively), then impinges on an Iron doped Lithium Niobate (Fe:LiNbO$_3$) photorefractive crystal (PRC) 408. The imaging relay lens pair 406A-406B is used to scale the imaging size of the input SLM 404 to match that of the input pupil of the PRC 408. The imaging relay lens pair 406A-406B may also sharply image the input SLM 404 image onto the recording plane of a CCD 410 placed behind the PRC 408.

The PRC 408 is the holographic recording device capable of large capacity, rewriteable, holographic memory recording. The other beam (i.e. the reference beam) will first pass through the imaging relay lens pair 406C-406D (also referred to as lens L3 and L4 respectively) before impinging upon the MEMS mirror 412. The laser beam will then be deflected by the MEMS mirror 412 by a pre-determined incremental angle. The deflected reference beam will continue to pass through the third imaging relay lens pair 406E-406F (also referred to as lens L5 and L6 respectively) and reach the PRC 408. The reference beam and the data beam intersect within the volume of the PRC 408 forming a 90° recording geometry. Focal lengths/distances (e.g., f3+f4) and aperture size of the lens pair 406C-406D is selected to compensate the scale difference between the input SLM 404 aperture and that of the MEMS mirror 412. Similarly, the lens pair 406E-406F feature dimensions (e.g., focal distances f5 and f6) that are selected to match the scale difference between the MEMS mirror 412 and the PRC 408 entrance pupil.

The MEMS mirror 412 scans the reference beam along the horizontal plane (or the x-axis) in parallel with the C-axis. During holographic data recording, the deflected angle from the MEMS mirror 412 is varied by a small increment with respect to each new data page. Thus, the interference pattern formed between each page of input data beam and the specifically oriented reference beam will be recorded in the PR crystal 408 in an angular multiplexing scheme.

During readout, the data beam will be shut down and the reference beam will be activated to illuminate the PR crystal 408. Due to the principle of holographic wavefront reconstruction, the stored page data, corresponding to a specific reference beam angle, will be readout. The readout data beam will be sharply imaged onto the CCD 410 recording plane.

Multilevel Spatial Light Modulator

One or more embodiments of the invention utilize a multilevel (i.e., multiple level) spatial light modulator. An example of such an SLM is the deformable mirror device also referred to as a digital micromirror device (DMDSLM) available from Texas Instruments. As used herein, the term DMD-SLM is used to refer to all forms of multiple level spatial light modulators including the deformable mirror device or digital micromirror device.

The holographic memory system architecture of the invention utilizes a DMDSLM for high speed up to 12-bit data input conversion, a matching CMOS photodetector array for data readout and transfer, as well as a beam steering device (liquid crystal phase array or high-speed MEMS mirror as described above) for beam steering without moving parts, a photorefractive crystal for holographic data recording, and associated imaging/beam forming optics. Due to the use of time-multiplexing and multilevel DMDSLM, to replace the prior art binary (2-level) SLM, a multi-bit hologram can be recorded to increase the storage density (eight [8] times increase for 3-bit hologram, 256 times increase for 8-bit hologram) without increasing the system volume. The DMD-SLM also provides the ability for a superior transfer rate (i.e., 7.6 Gbit/sec or higher). Thus, the resulting hologram memory system is simultaneously high density, high bandwidth, and low volume.

Figure 4B:
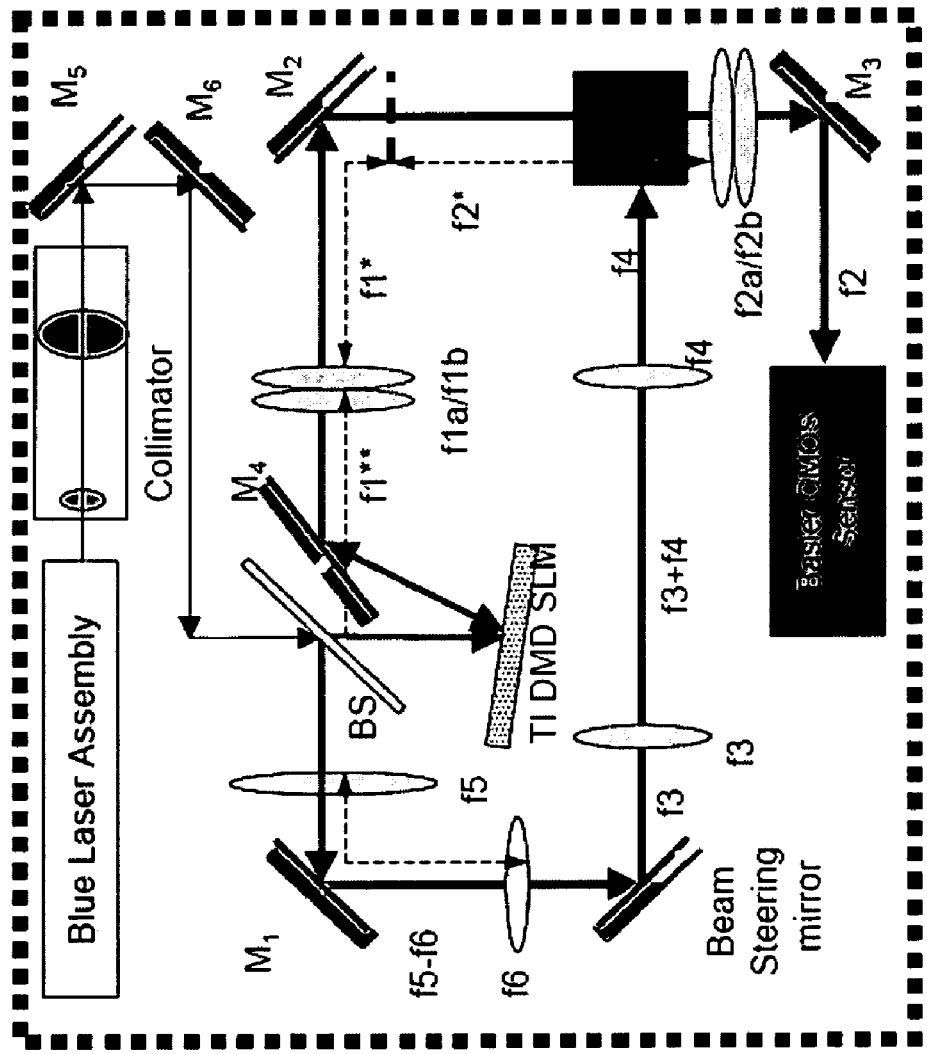
FIG. 4B illustrates a holographic memory system architecture utilizing a DMDSLM in accordance with one or more embodiments of the invention.

FIG. 4B illustrates a multilevel holographic memory system in accordance with one or more embodiments of the invention. As illustrated, the blue laser assembly emits a laser that passes through a collimator to establish a collimated beam. The collimated beam is reflected in mirrors M5 and M6 to a beam splitter. The reference beam passes through image relay lens pairs f5 and f6 and mirror f1 to the high speed beam steering mirror. Thereafter, the beam passes through imaging relay lens pair f3 and f4 to the PRC. The data/input beam passes from the beam splitter to the DMDSLM (e.g., by Texas Instruments™) to mirror M4 and image relay lens pair f1*an* and f1*b*. The data/input beam is reflected by mirror M2 to the PRC where the multibit/multilevel hologram can be recorded in the form of the interference pattern. The different focal lengths are indicated in the drawing accordingly. As illustrated, the imaging relay lens pair f1*a*/f1*b* are positioned between the multilevel spatial light modulator and the photorefractive crystal to image a multibit spatial light modulator image on a plane behind the photorefractive crystal.

To readout the data, the input beam (containing the multibit data stored in the PRC) is reflected from the PRC though image relay lens pair f2A/f2B to mirror M3 onto the Basler CMOS sensor.

Figure 5:
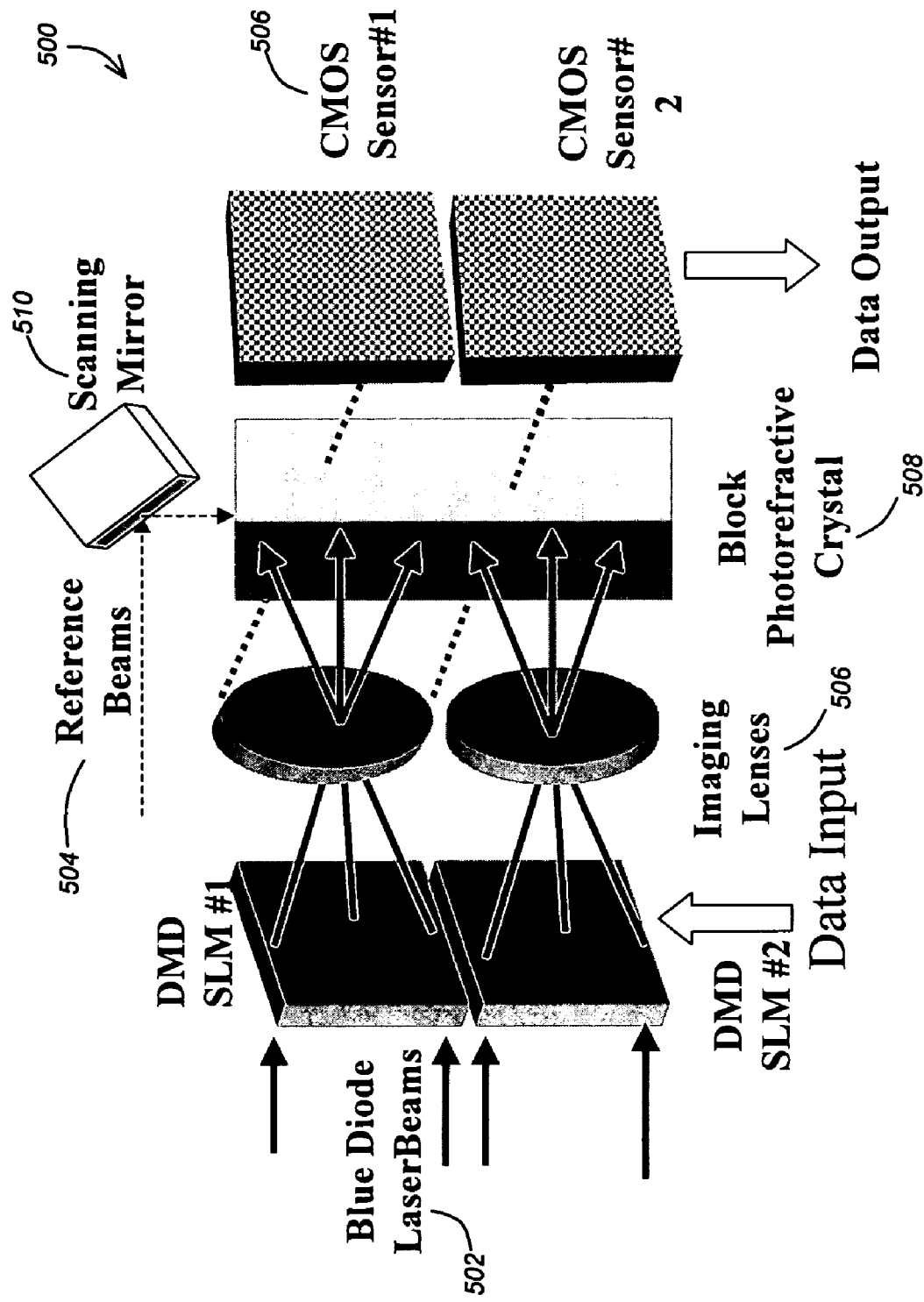
FIG. 5 illustrates a dual-channel multilevel hologram memory system in accordance with one or more embodiments of the invention.

FIG. 5 illustrates a dual-channel multilevel hologram memory system in accordance with one or more embodiments of the invention. As illustrated in system 500, the input data is broken up into blue diode laser beams 502 (i.e., the data beams) and the reference beams 504. The data beams 502 pass through the pair of DMDSLMs (DMDSLM #1 and DMDSLM#2) to create a multilevel/multibit beam. The multilevel/multibit beam is focused on the block photorefractive crystal (i.e., the PRC 508) via the optics illustrated as the imaging relay lens pair 506. The reference beam 504 is directed via the scanning mirror 510 to the PRC 508 where the interference pattern can be recorded with multiple levels/bits.

To readout the data, the reference beam 504 is used to illuminate the PRC 508 and the output is recorded on the CMOS sensors 506.

In view of the above, the DMDSLM is used as the input device to the holographic memory system/cube 500. Such a use of a DMD provides a transfer rate of 7.6 Gb/sec which is about eight times higher than the prior art ferroelectric liquid crystal SLM. In addition, the DMDSLM possesses 8-10 bit grayscale resolution with 2000:1 high contrast thereby enabling a multilevel digital hologram within the PRC 508. Such a multilevel hologram maintains 3-bit resolution. Thus, the data storage density increases from 1 bit/pixel to 8 bits/pixel (i.e., 1 byte/pixel) resulting in the ability to record 6.2 terabytes instead of the prior art capacity of 775 GB.

Figure 6A:
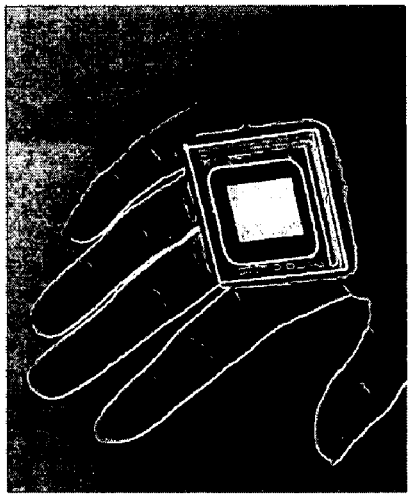
FIGS. 6A and 6B illustrate photographs of a DMDSLM that can be used in accordance with one or more embodiments of the invention.
Figure 6B:
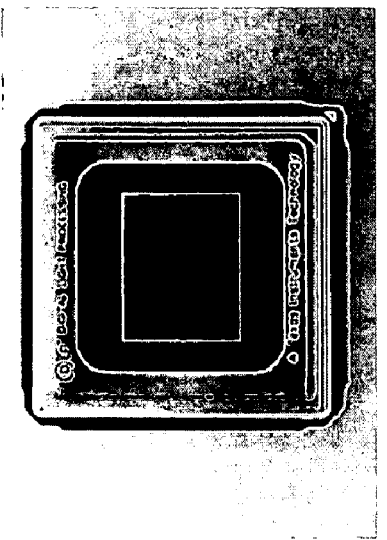
Figure 7:
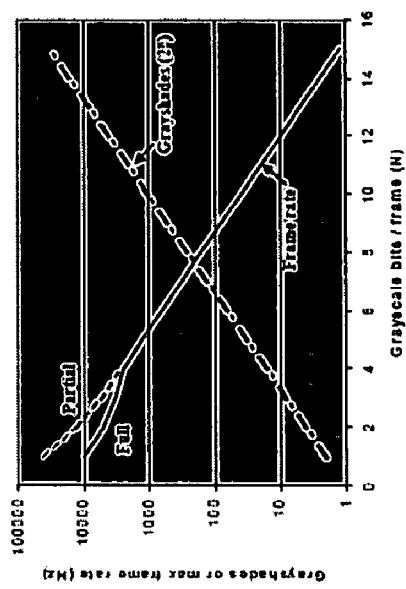
FIG. 7 illustrates the maximum frame rate as a function of digital bits in accordance with one or more embodiments of the invention.

FIGS. 6A and 6B illustrate photographs of a DMDSLM that can be used in accordance with one or more embodiments of the invention. Such a DMDSLM has been used in a digital light processor (DLP) of the prior art. DLP technology enables digital, high-resolution, color projection displays that have high contrast, are bright, are seamless, and have the accuracy of color and gray scale that only digital control can achieve. In a DLP system, each mirror of the DMD represents a pixel. The total size of the DMD may be utilized to produce a resolution of 1024 pixels×768 pixels with each mirror being a 16 μm square (i.e., 16 μm×16 μm) producing an aperture size of 1.64 cm×1.23 cm. In addition, in a DLP system one may utilize 8 or 10-bit resolution and a 7.6 Gb/sec (or up to a 9.7 Gb/sec) data transfer/throughput rate. Such a throughput provides 9,700 fps for binary data, 1,220 fps for 3-bit data or 38 fps for 8-bit data. In addition, high definition (i.e., 1920× 1080 resolution) may have a 20.1 Gb/sec throughput rate. FIG. 7 illustrates the maximum frame rate as a function of digital bits in accordance with one or more embodiments of the invention. As illustrated, the maximum frame rate decreases as the number of bits/frame increases.

Figure 8:
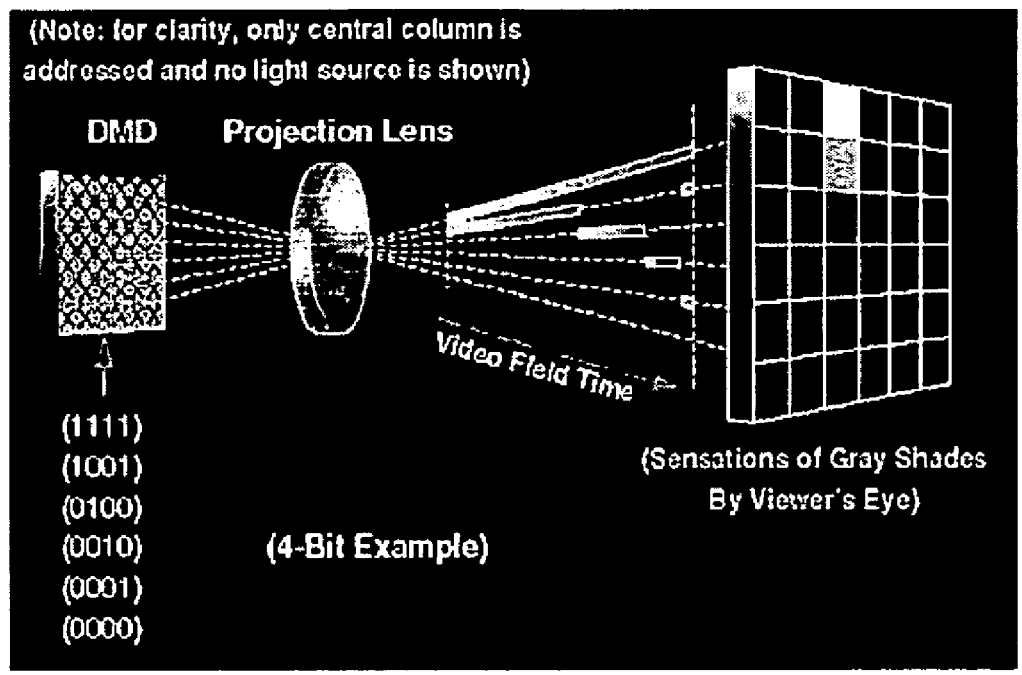
FIG. 8 illustrates a DMD device used in high definition television and a projection display (i.e., a DLP system) of the prior art.

FIG. 8 further illustrates a DMD device used in high definition television and a projection display (i.e., a DLP system) of the prior art. In addition, FIG. 8 is an example of binary pulsewidth modulation. In this simple example, the DMD array is illuminated with constant intensity light (not shown) and only 4-bit words are input to the array, representing 16 possible gray levels. A projection lens focuses and magnifies the light reflected from each pixel onto a distant projection screen. For clarity, only the central column is addressed. It is assumed that the others are addressed to the dark state (0000). An electrical word is input into the memory element of each light switch one bit at a time, beginning with the most significant bit (MSB) for each word.

When the entire array of light switches has been addressed with the MSB, the individual pixels are enabled (reset) so that they can respond in parallel to their MSB state (1 or 0). During each bit time, the next bit is loaded into the memory array. At the end of each bit time, the pixels are reset and they respond in parallel to the next address bit. The process is repeated until all address bits are loaded into memory.

Incident light is reflected from the light switches and is switched or modulated into light bundles having durations represented by each bit in the electrical word. To an observer, the light bundles occur over such a small time compared to the integration time of the eye that they give the physical sensation of light having a constant intensity represented by the value of the 4-bit input word.

Figure 9:
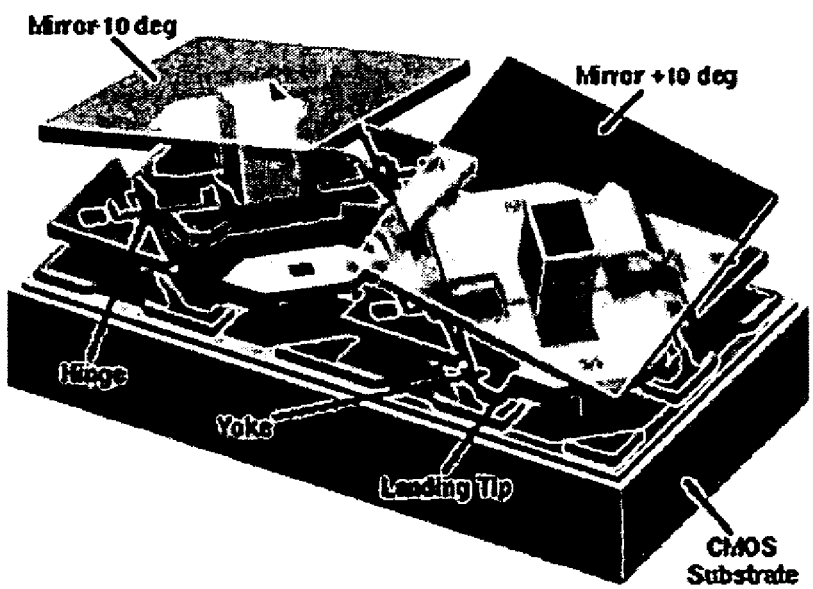
FIG. 9 illustrates the detailed architecture of a DMDSLM that can be used in the holographic memory in accordance with one or more embodiments of the invention.

In view of the above, one may examine the detailed architecture of a DMDSLM that can be used in the holographic memory of the present invention as illustrated in FIG. 9. The address circuit and electromechanical superstructure of each pixel support one simple function, the fast and precise rotation of an aluminum micromirror, 16 μm square, through angles of +10 and p; 10 degrees. In FIG. 8, the architecture of two pixels are illustrated, showing the mirrors as semitransparent so that the structure underneath can be observed. The DMD pixel is a monolithically integrated MEMS superstructure cell fabricated over a CMOS SRAM cell/substrate. Plasma etching a sacrificial layer develops air gaps between the metal layers of the superstructure. The air gaps free the structure to rotate about two compliant torsion hinges. The mirrors are connected to underlying yokes which in turn are suspended by two thin torsion hinges to support posts. The yokes are electrostatically attracted to the underlying yoke address electrodes. The mirrors are electrostatically attracted to mirror address electrodes. The mirrors and yokes rotate until the yokes come to rest against mechanical stops that are at the same potential as the yoke. The position of the mechanical stops limits the mirrors' rotation angle to +10 or −10 degrees.

Table 1 below illustrates the data transfer rate using multilevel digital holograms in accordance with one or more embodiments of the invention. The devices listed in Table 1 include a DMDSLM from Texas Instruments™, a CMOS sensor from Red Lake™, and a MEMS mirror from Chromux™.

TABLE 1

| Key devices performance | TI ™ DMD SLM | Red Lake ™ CMOS Sensor | Chromux ™ MEMS mirror |
|---|---|---|---|
| Resolution and frame rate | 1024 × 768 1212 fps | 1504 × 1128 @1000 fps or 1024 × 768 @ 2157 fps | Up to 2000 fps 2-D scanning |
| Grayscale | 3 bits | 8 bit | |
| Data throughput rate | 7.63 Gb/s | 13 Gb/s | |

Table 2 illustrates the storage density using multilevel digital holograms in accordance with one or more embodiments of the invention.

TABLE 2

| Beam Steering Technology | Beam Steering Mirror |
|---|---|
| Angular Resolution | .001° |
| Minimum Bragg Angle | .002° |
| Angular steering ranges | 5° |
| Storage pages | |
| (1-D scanning) | $2.5 \times 10^3$ pages |
| (2-D scanning) | $6.25 \times 10^6$ pages |
| Storage density | |
| With 1024 × 768 × 1-bit/page | 775 GB |
| With 1024 × 768 × 3-bit/page Dual Channel HMC | 6.2 TB |
| Storage Density | 13.4 TB |

Logical Flow

Figure 10:
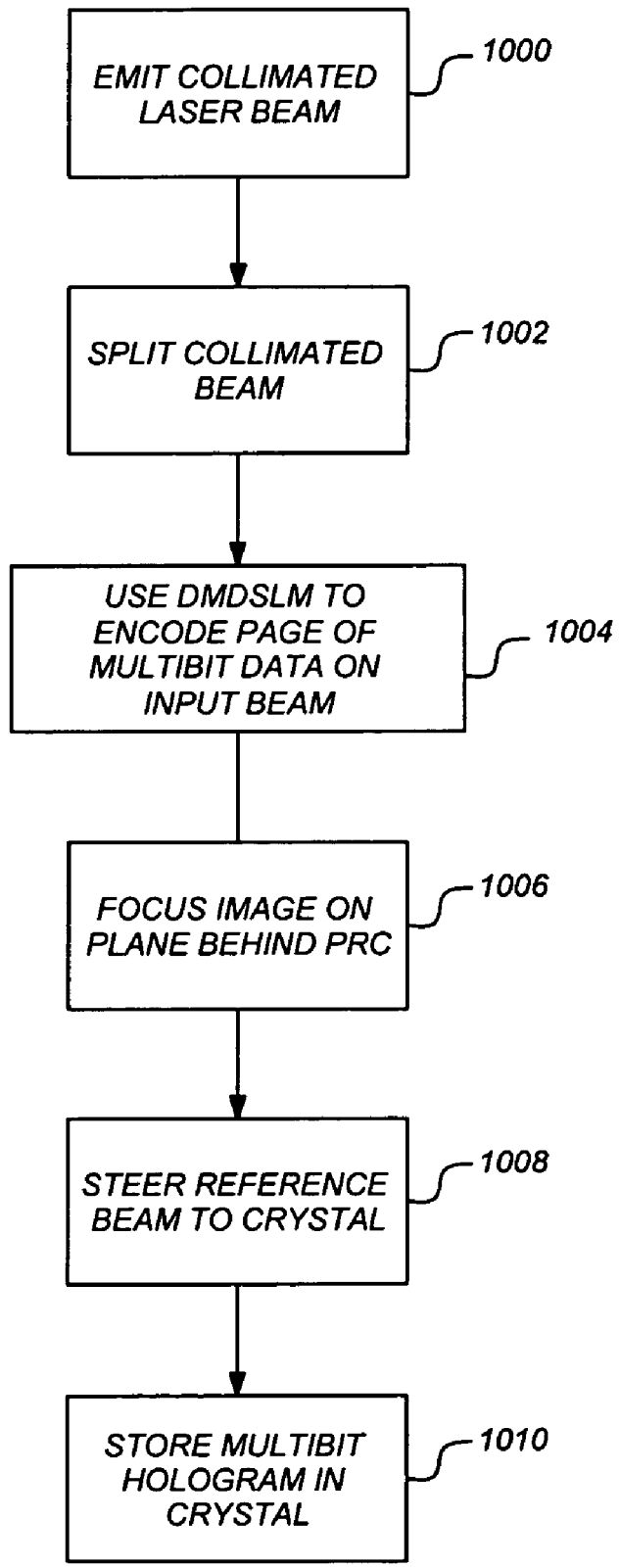
FIG. 10 is a flow chart that illustrates a method for storing multibit data in holographic memory in accordance with one or more embodiments of the invention.

FIG. 10 is a flow chart that illustrates a method for storing multibit data in holographic memory. At step 1000, a single laser diode emits a collimated laser beam for both writing a multibit hologram to and reading the multibit hologram from a photorefractive crystal. At step 1002, the collimated laser beam is split into a reference beam and an input beam.

At step 1004, a multilevel spatial light modulator (DMD-SLM) encodes the page of multibit data onto the input beam split from the collimated laser beam. At step 1006, a first imaging relay lens pair positioned between the multilevel spatial light modulator and the PRC steers/focuses the input beam (with the encoded data) (also referred to as the multibit spatial light modulator image) on a plane behind the PRC. As described above, the DMDSLM can be a digital micromirror device (e.g., available from Texas Instruments™.

At step 1008, one or more mirrors are used to steer the reference beam, split from the collimated laser beam, at high speed to the PRC to read or write a page of multi-bit data. Such mirrors may be liquid crystal phase arrays or high speed micro-electro-mechanical systems (MEMS) mirrors. Consequently, at step 1010, the multibit hologram is stored in the PRC (i.e., based on the interference pattern from the reference beam and input beam).

CONCLUSION

This concludes the description of the preferred embodiment of the invention. In accordance with embodiments of the invention, an advanced holographic memory technology with a multilevel hologram may be used to enable high-density and high-speed holographic data storage with random access during data recording and readout.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A holographic memory system comprising:
   (a) a photorefractive crystal configured to store multibit holograms;
   (b) a single laser diode configured to emit a collimated laser beam to both write multibit data to and read the multibit data from the photorefractive crystal;
   (c) a multilevel spatial light modulator to encode the multibit data on an input beam split from the collimated laser beam, wherein:
      (i) the multibit data is encoded into a pixel data set comprising multiple bits per pixel;
      (ii) the multilevel spatial light modulator encodes the pixel data set into a single pixel by modulating the input beam into light bundles having durations represented by each bit of the pixel data set; and
      (iii) the multilevel spatial light modulator provides multibit data input conversion resulting in a multilevel beam;
   (d) a first imaging relay lens pair positioned between the multilevel spatial light modulator and the photorefractive crystal to image a multibit spatial light modulator image on a plane behind the photorefractive crystal and
   (e) one or more mirrors configured to steer a reference beam, split from the collimated laser beam, at high speed to the photorefractive crystal to read or write the multibit data.

2. The system of claim 1, wherein the reference beam and the input beam, obtained from the collimated laser beam, create an interference pattern in the photorefractive crystal to record the multibit hologram.

3. The system of claim 1, wherein the multilevel spatial light modulator comprises a digital micromirror device.

4. The system of claim 1, wherein the one or more mirrors comprise liquid crystal phase arrays.

5. The system of claim 1, wherein the one or more mirrors comprise high speed Micro-Electro-Mechanical Systems (MEMS) mirrors.

6. A method for storing data in holographic memory comprising:
   a single laser diode emitting a collimated laser beam for both writing a multibit data to and reading the multibit data from a photorefractive crystal;
   splitting the collimated laser beam into a reference beam and an input beam;
   passing the input beam through a multilevel spatial light modulator to encode the data in the input beam, wherein:
      (i) the multibit data is encoded into a pixel data set comprising multiple bits per pixel;
      (ii) the multilevel spatial light modulator encodes the pixel data set into a single pixel by modulating the input beam into light bundles having durations represented by each bit of the pixel data set; and
      (iii) the multilevel spatial light modulator provides multibit data input conversion resulting in a multilevel beam;
   passing the input beam through a first imaging relay lens pair for imaging a multibit spatial light modulator image on a plane behind the photorefractive crystal;
   one or more mirrors steering the reference beam at high speed to the photorefractive crystal; and
   storing the multibit data in the photorefractive crystal in a form of an interference pattern created by the steered reference beam and the input beam.

7. The method of claim 6, wherein the multilevel spatial light modulator comprises a digital micromirror device.

8. The method of claim 6, wherein the one or more mirrors comprise liquid crystal phase arrays.

9. The method of claim 6, wherein the one or more mirrors comprise high speed Micro-Electro-Mechanical Systems (MEMS) mirrors.

10. An apparatus for storing data in a holographic memory comprising:
    means for storing one or more pages of multibit data;
    means for emitting a collimated laser beam to both write to and read from the means for storing;
    multilevel spatial light modulator means for encoding the multibit data on an input beam split from the collimated laser beam, wherein:
       (i) the multibit data is encoded into a pixel data set comprising multiple bits per pixel;
       (ii) the multilevel spatial light modulator encodes the pixel data set into a single pixel by modulating the input beam into light bundles having durations represented by each bit of the pixel data set; and
       (iii) the multilevel spatial light modulator provides multibit data input conversion resulting in a multilevel beam;
    means for imaging a multibit spatial light modulator image on a plane behind the means for storing; and
    one or more mirrors configured to steer a reference beam, split from the collimated laser beam, at high speed to the means for storing to read or write the multibit data.

11. The apparatus of claim 10, wherein the reference beam and the input beam, obtained from the collimated laser beam, create an interference pattern in the means for storing to record a multibit hologram.

12. The apparatus of claim 10, wherein the multilevel spatial light modulator comprises a digital micromirror device.

13. The apparatus of claim 10, wherein the one or more mirrors comprise liquid crystal phase arrays.

14. The apparatus of claim 10, wherein the one or more mirrors comprise high speed Micro-Electro-Mechanical Systems (MEMS) mirrors.

* * * * *